United States Patent
Jang

(10) Patent No.: US 11,201,133 B2
(45) Date of Patent: Dec. 14, 2021

(54) BONDING APPARATUS AND METHOD

(71) Applicant: Samsung Display Co., Ltd., Yongin-si (KR)

(72) Inventor: Joo Nyung Jang, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/675,039

(22) Filed: Nov. 5, 2019

(65) Prior Publication Data

US 2020/0168581 A1 May 28, 2020

(30) Foreign Application Priority Data

Nov. 28, 2018 (KR) ........................ 10-2018-0149841

(51) Int. Cl.
*H01L 23/00* (2006.01)
*H01L 27/32* (2006.01)
(Continued)

(52) U.S. Cl.
CPC .............. *H01L 24/83* (2013.01); *H01L 22/20* (2013.01); *H01L 23/4985* (2013.01);
(Continued)

(58) Field of Classification Search
CPC . H01L 2224/83201; H01L 2224/83203; H01L 2224/83208; H01L 2224/83091; H01L 2224/75252; H01L 2224/83851; H01L 2224/83855; H01L 2224/83856; H01L 2224/83862; H01L 2224/759; H01L 2224/7592; H01L 2224/83908; H01L 2224/83169; H01L 2224/8319; H01L 2224/83193; H01L 2224/27001;
(Continued)

(56) References Cited

U.S. PATENT DOCUMENTS 8,895,359 B2 * 11/2014 Tomura ............... H01L 23/3142
438/108
2005/0196897 A1 9/2005 Kuboi
(Continued)

FOREIGN PATENT DOCUMENTS

JP 2000-340585 A 12/2000
JP 2006-253384 A 9/2006
(Continued)

OTHER PUBLICATIONS

Tekscan, Inc., "I-Scan Product Selection Guide", URL http://www.tekscan.com/sites/default/files/resources/IDL-ISCAN-SelectionGuide_RevE.pdf, dated, Jun. 8, 2015, 28 pages.

*Primary Examiner* — Scott B Geyer
(74) *Attorney, Agent, or Firm* — Lewis Roca Rothgerber Christie LLP

(57) ABSTRACT

A bonding apparatus and method includes: a stage configured to fix a first electric component; a pressing unit configured to press a conductive adhesive film and a second electric component onto the first electric component; a driver configured to control movement of the pressing unit along a direction; and a plurality of sensors at different positions on the stage and configured to sense a change in capacitance with the pressing unit, wherein the pressing unit includes a flat metal material in first regions facing the plurality of sensors.

6 Claims, 13 Drawing Sheets

(51) Int. Cl.
    *H01L 23/498*     (2006.01)
    *H01L 21/66*     (2006.01)

(52) U.S. Cl.
    CPC .............. *H01L 24/32* (2013.01); *H01L 24/75* (2013.01); *H01L 27/3276* (2013.01); *H01L 2224/32227* (2013.01); *H01L 2224/7592* (2013.01); *H01L 2224/75252* (2013.01); *H01L 2224/83002* (2013.01); *H01L 2224/83201* (2013.01); *H01L 2224/83851* (2013.01); *H01L 2224/83908* (2013.01); *H01L 2924/1426* (2013.01)

(58) Field of Classification Search
    CPC ..... H01L 2224/27009; H01L 21/67121; H01L 21/67132; H01L 21/02041; H01L 21/02046; H01L 21/02057; H01L 21/02096
    See application file for complete search history.

(56) References Cited

U.S. PATENT DOCUMENTS

| | | | | |
|---|---|---|---|---|
| 2008/0011415 | A1* | 1/2008 | Kiuchi | H01L 21/6836 |
| | | | | 156/247 |
| 2011/0020983 | A1* | 1/2011 | Tomura | H01L 24/75 |
| | | | | 438/108 |
| 2017/0186724 | A1* | 6/2017 | Chylak | H01L 24/13 |
| 2017/0207190 | A1* | 7/2017 | Tsukao | H01L 24/17 |
| 2018/0312731 | A1* | 11/2018 | Honda | C09J 163/00 |

FOREIGN PATENT DOCUMENTS

| | | | |
|---|---|---|---|
| JP | 4294451 B2 | 7/2009 | |
| JP | 4530688 B2 | 8/2010 | |
| JP | 4534342 B2 | 9/2010 | |
| JP | 5797368 B2 | 10/2015 | |
| KR | 10-0782233 B1 | 12/2007 | |
| KR | 10-1543317 B1 | 8/2015 | |
| WO | WO-2013183507 A1 * | 12/2013 | ............ H01L 24/75 |

* cited by examiner

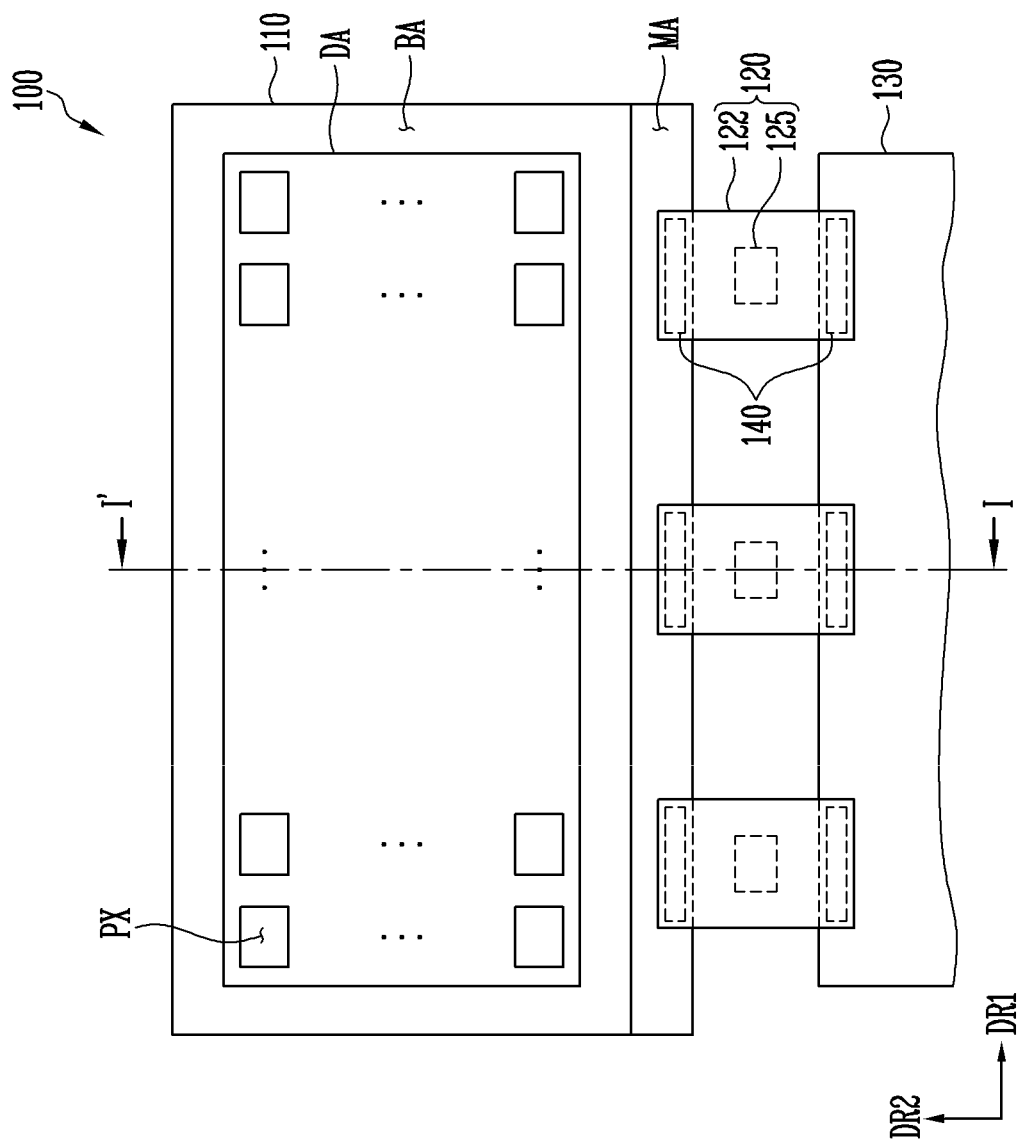

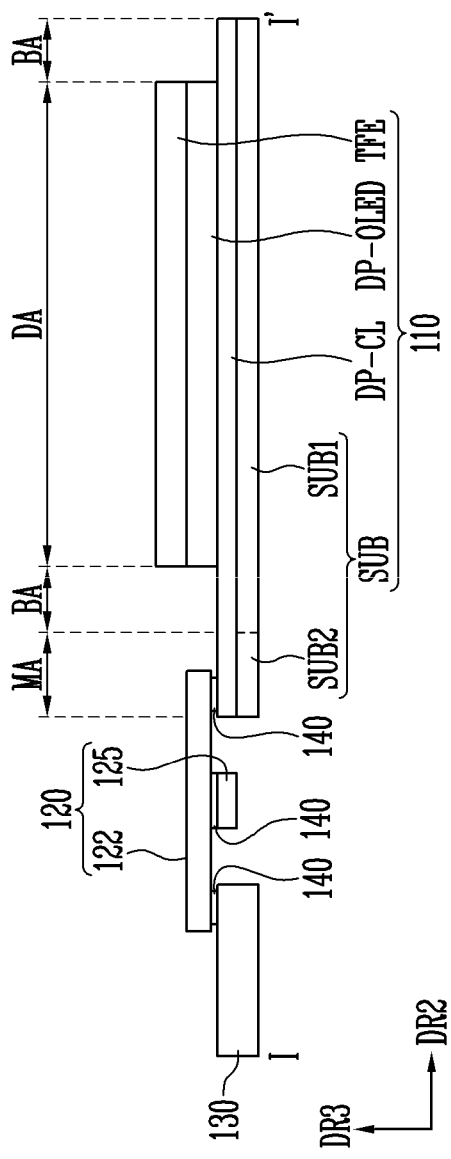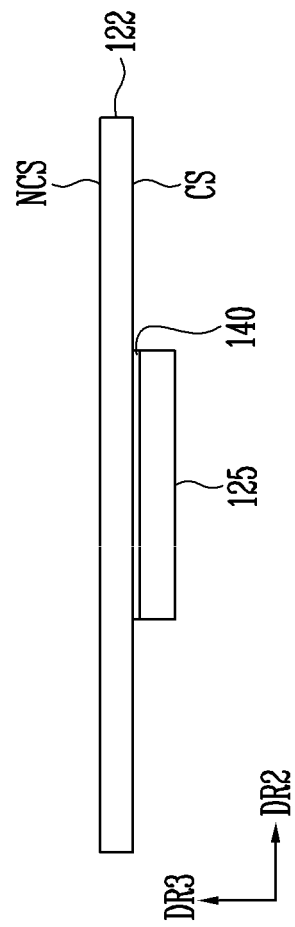

BONDING APPARATUS AND METHOD

CROSS-REFERENCE TO RELATED APPLICATION

This application claims priority to and the benefit of Korean Patent Application No. 10-2018-0149841, filed in the Korean Intellectual Property Office on Nov. 28, 2018, the entire contents of which are incorporated herein by reference.

BACKGROUND

1. Field

Embodiments of the present invention relate to a bonding apparatus and method.

2. Description of the Related Art

In general, an electric device (e.g., an electronic device) includes a plurality of electric components.

Electric devices, such as portable phones, laptop computers, and televisions, generally include a display panel configured to display images, a main wire substrate, and a flexible wire substrate.

When two electric components are electrically connected to each other, they may be electrically connected through a bonding of pad units. A process for electrically connecting the pad units of the two electric components to each other may include a process of aligning and bonding the pad units of the two electric components to each other (hereinafter, a bonding process).

SUMMARY

Exemplary embodiments of the present invention provide a bonding apparatus and bonding method having a structure that is capable of reducing defects during the bonding process (e.g., of reducing an inferiority rate occurring in the bonding process).

A bonding apparatus according to an exemplary embodiment of the present invention includes a stage configured to fix a first electric component; a pressing unit configured to press a conductive adhesive film and a second electric component onto the first electric component; a driver configured to control movement of the pressing unit along a first direction; and a plurality of sensors at different positions on the stage and configured to sense a change in capacitance with the pressing unit, wherein the pressing unit includes a flat metal material in first regions facing the plurality of sensors.

In addition, the pressing unit may include a pressing head coupled to the driver; a pressing tip configured to press the conductive adhesive film and the second electric component when the pressing head moves toward the stage along the first direction; and a heat source that extends from the pressing head and is configured to transfer heat to the conductive adhesive film and the second electric component when the pressing head moves toward the stage along the first direction.

In addition, the plurality of sensors may be configured to sense the change in capacitance when the pressing head moves along the first direction.

In addition, the pressing head may include: a main body coupled to the driver, the first regions being located on the main body; and a connection part extending between the main body and the pressing tip, wherein a cross-sectional area of the connection part decreases as a distance from the main body increases.

In addition, the connection part may extend from the main body in a second region, the second region being different from the first region.

In addition, the heat source may enclose at least a portion of the main body at at least one side of the main body.

In addition, a cross-sectional area of the main body in the first region may be smaller than a cross-sectional area of the main body in the second region.

In addition, the capacitance may change in response to a distance between each of the plurality of sensors and the pressing unit.

In addition, the change in capacitance sensed in each of the plurality of sensors may be the same at an equilibrium state of the pressing unit when the pressing unit presses.

A bonding method according to an exemplary embodiment of the present invention includes: fixing a first electric component on a stage; attaching a conductive adhesive film on the first electric component; arranging a second electric component on the conductive adhesive film; arranging a dummy film on the second electric component; pressing the conductive adhesive film, the second electric component and the dummy film by driving a pressing unit; and removing the dummy film, wherein a first side of the dummy film which contacts the second electric component is adhesive.

In addition, the first side of the dummy film may be configured to remove particles that inflow onto the second electric component.

In addition, a plurality of sensors may be located at different locations on the stage, and the pressing the conductive adhesive film, the second electric component and the dummy film by driving the pressing unit may include sensing a change in capacitance between each of the plurality of sensors and the pressing unit.

In addition, the bonding method may further include controlling an equilibrium state of the pressing unit based on a result of the sensing the change in capacitance between each of the plurality of sensors and the pressing unit.

In addition, the capacitance may change in response to a distance between each of the plurality of sensors and the pressing unit.

In addition, the change in capacitance sensed in each of the plurality of sensors may be the same at an equilibrium state of the pressing unit when the pressing unit presses.

A bonding apparatus and method according to an exemplary embodiment of the present invention may reduce a defect rate caused by mechanical defects or particles of a pressing unit during a bonding process.

BRIEF DESCRIPTION OF THE DRAWINGS

FIG. 1 is a plan view of an electric device according to an exemplary embodiment of the present invention.

FIG. 2 is a cross-sectional view taken along the line I-I' of FIG. 1.

FIG. 3 is a side view of a second electric component according to an exemplary embodiment of the present invention.

DETAILED DESCRIPTION

Figure 4:
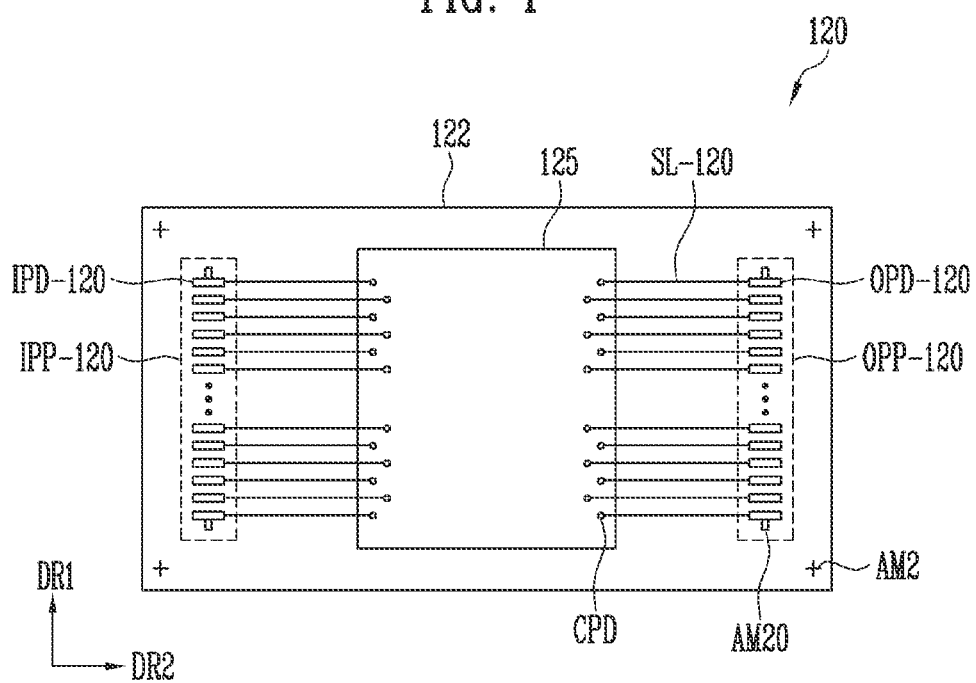
FIG. 4 is a plan view of the second electric component according to an exemplary embodiment of the present invention.

Hereinafter, example embodiments will be described in more detail with reference to the accompanying drawings. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described or shown in the figures. Unless otherwise noted, like reference numerals denote like elements throughout the attached drawings and the written description, and thus, descriptions thereof may not be repeated. In the drawings, the relative sizes of elements, layers, and regions may be exaggerated for clarity.

It will be understood that, although the terms "first," "second," "third," etc., may be used herein to describe various elements, components, regions, layers, and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the terms "substantially," "about," and similar terms are used as terms of approximation and not as terms of degree, and are intended to account for the inherent variations in measured or calculated values that would be recognized by those of ordinary skill in the art. Further, the use of "may" when describing embodiments of the present invention refers to "one or more embodiments of the present invention." In addition, the use of alternative language, such as "or," when describing embodiments of the present invention, refers to "one or more embodiments of the present invention" for each corresponding item listed. As used herein, the terms "use," "using," and "used" may be considered synonymous with the terms "utilize," "utilizing," and "utilized," respectively. Also, the term "exemplary" is intended to refer to an example or illustration.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

FIG. 1 is a plan view showing an electric device according to an exemplary embodiment of the present invention, and FIG. 2 is a cross-sectional view taken along the line I-I' of FIG. 1. FIG. 3 is a side view of a second electric component according to an exemplary embodiment of the present invention, and FIG. 4 is a plan view of the second electric component according to an exemplary embodiment of the present invention.

Referring to FIGS. 1 and 2, an electric device 100 according to an exemplary embodiment of the present invention includes a first electric component 110, a second electric component 120, and a third electric component 130. The first, second, and third electric components 110, 120, and 130 are electrically connected to each other. In an exemplary embodiment of the present invention, the first electric component 110 may be an electro-optical panel, the second electric component 120 may be a connection wire substrate, and the third electric component 130 may be a main circuit board. According to an exemplary embodiment of the present invention, the electric device 100 may include three second electric components 120, but the present invention is not limited thereto, and may include any suitable number of second electric components 120. For example, according to the use or size of the electric device 100, the electric device 100 may include one second electric component 120, two second electric components 120, or three or more second electric components 120.

As shown in FIG. 1, the first electric component 110 (hereinafter, also referred to as a display panel or an electro-optical panel) may be a display panel that is configured to display an image by applying a driving signal to a plurality of pixels PX. The plurality of pixels PX may be disposed in a matrix form in a first direction DR1 and a second direction DR2 orthogonal to each other. In an exemplary embodiment of the present invention, each of the pixels PX may display one of a red color, a green color, or a blue color. However, the present invention is not limited thereto. For example, the pixels PX may display one of a white color, a cyan color, or a magenta color. The pixels PX may be defined as a display part of the display panel 110.

According to a type of the pixels PX, the display panel 110 may be one of a liquid crystal panel, an organic light emitting panel, and an electrowetting display panel. Hereinafter, for convenience of description, the display panel 110 is described as an organic light emitting panel, but the present invention is not limited thereto.

The display panel 110 may be divided into a display region DA in which a plurality of pixels PX are disposed, a non-display region BA surrounding the display region DA, and a mounting area MA to which the second electric component 120 is coupled in a plane view. In an exemplary embodiment of the present invention, the non-display region BA and the mounting area MA may not be distinguished (e.g., may have characteristics that are substantially the same). In some embodiments, the non-display region BA may be omitted, or the mounting area MA may be a portion of the non-display region BA.

As shown in FIG. 2, the display panel 110 may include a base substrate SUB, a first layer DP-CL (e.g., a circuit layer), a second layer DP-OLED (e.g., an organic light emitting element layer), and a thin film encapsulation layer TFE. The base substrate SUB may include a first layer SUB1 and a second layer SUB2. The first layer SUB1 may correspond to the display region DA and the non-display region BA, and the second layer SUB2 may correspond to the mounting area MA. In another exemplary embodiment of the present invention, the non-display region BA may include the mounting area MA. In some embodiments, the first layer SUB1 may correspond to the display region DA, and the second layer SUB2 may correspond to the non-display region BA. The base substrate SUB may include a plastic substrate, such as polyimide, a glass substrate, and/or a metal substrate.

A black matrix configured to block light may be disposed in the non-display region BA. A gate driving circuit for supplying a gate signal to a plurality of pixels PX may be provided in the non-display region BA. In an exemplary embodiment of the present invention, a data driving circuit may be further provided in the non-display region BA. A pad unit for receiving a signal supplied from the second electric component 120 may be disposed in the mounting region MA.

As shown in FIGS. 1 and 2, the second electric component 120 includes a flexible wire substrate 122 and a driving IC 125. The driving IC 125 may be, for example, a data driving circuit, a scan driving circuit, or the like.

The driving IC 125 may include at least one driving chip. The driving IC 125 is electrically connected to lines of the flexible wire substrate 122. The driving IC 125 and the flexible wire substrate 122 may be connected (e.g., electrically connected) by a conductive adhesive film 140.

When the second electric component 120 includes a driving IC 125, the pad unit of the display panel 110 may include data pad electrodes electrically connected to data lines and control signal pad electrodes electrically connected to control signal lines. The data lines may be connected to the pixels PX, and the control signal lines may be connected to the gate driving circuit. In an exemplary embodiment of the present invention, the second electric component 120 may have a chip on film structure, but the second electric component 120 is not limited thereto.

Referring to FIGS. 3 and 4, the second electric component 120 is described in more detail. The flexible wire substrate 122 includes a base film, a plurality of pads CPD, IPD-120, and OPD-120 on the base film, and a plurality of lines SL-120. The plurality of pads CPD, IPD-120, and OPD-120 and the plurality of lines SL-120 are disposed on the base film. The base film may include, for example, polyimide.

The plurality of pads CPD, IPD-120 and OPD-120 may include connection pads CPD connected to connection terminals of the driving IC 125, input pads IPD-120 connected to the third electric component 130, and output pads OPD-120 connected to the display panel 110. The input pads IPD-120 are defined as input pad unit IPP-120 disposed on one side (e.g., a first side or a first end) of the flexible wire substrate 122, and the output pads OPD-120 are defined as output pad unit OPP-120 disposed on an opposite side (e.g., a second side or a second end) of the flexible wire substrate 122. In an exemplary embodiment of the present invention, the connection pads CPD are aligned to overlap on both sides of the driving IC 125, but the connection pads CPD may be randomly arranged corresponding to connection terminals of the driving IC 125 according to other embodiments of the present invention.

In an exemplary embodiment of the present invention, the input pad unit IPP-120 and the output pad unit OPP-120 may include one pad row, as illustrated in FIG. 4. The pad row includes a plurality of pads arranged in (or along) the first direction DR1. In an exemplary embodiment of the present invention, each of the input pad unit IPP-120 and the output pad unit OPP-120 may include a plurality of pad rows.

Some of the lines SL-120 connect the connection pads CPD to the input pads IPD-120 and some (e.g., others) of the lines SL-120 connect the connection pads CPD to the output pads OPD-120. In some embodiments, the lines SL-120 may directly connect some (e.g., ones) of the input pads IPD-120 to some (e.g., ones) of the output pads OPD-120.

The flexible wire substrate 122 may further include a solder resist layer disposed on the base film to cover a plurality of the lines SL-120. The solder resist layer may further cover a periphery of the plurality of pads CPD, IPD-120, and OPD-120 and may expose at least a portion of each of the plurality of pads CPD, IPD-120, and OPD-120. Openings corresponding to the plurality of pads CPD, IPD-120, and OPD-120 may be formed in the solder resist layer.

In addition, the flexible wire substrate 122 may include first alignment marks AM2 and second alignment marks AM20 used in a bonding process described further below. FIG. 4 shows four of the first alignment marks AM2 spaced apart from the pads CPD, IPD-120, and OPD-120, and four of the second alignment marks AM20 connected to (e.g., on or extending from) ones of the input pads IPD-120 and the output pads OPD-120. According to embodiments, at least one of the first and second alignment marks AM2 and AM20 may be omitted.

In an exemplary embodiment of the present invention, an exposed surface of the input pads IPD-120 and the output pads OPD-120 is defined as a coupling surface CS of the flexible wire substrate 122, and a surface facing away from (or opposite to) the coupling surface CS is defined as a non-coupling surface NCS. In an exemplary embodiment of the present invention, the driving IC 125 may be on the coupling surface CS as shown in FIG. 3, but the present invention is not limited thereto, and the driving IC 125 may be disposed on the non-coupling surface NCS, for example.

Referring again to FIGS. 1-2, the third electric component 130 is configured to provide image data, a control signal, and a power voltage to the display panel 110 or the driving IC 125. The third electric component 130 is a wire substrate that is different from the flexible wire substrate 122 and may include active elements and passive elements. The third electric component 130 may be a flexible wire substrate or a rigid wire substrate that includes a pad unit connected to a flexible wire substrate 122.

Referring to FIGS. 1-4, the output pad unit OPP-120 of the flexible wire substrate 122 and a pad unit of the display panel 110 may be electrically connected to each other by a conductive adhesive film 140. The input pad unit IPP-120 of the flexible wire substrate 122 and a pad unit of the third electric component 130 may also be electrically connected by the conductive adhesive film 140. The conductive adhesive film 140 may be an anisotropic conductive film (ACF). In an exemplary embodiment of the present invention, a solder bump may be used in place of the conductive adhesive film 140.

The pad unit of the display panel 110 may include pads corresponding to the output pads OPD-120 of the flexible wire substrate 122. In addition, the pad unit of the third electric component 130 may include pads corresponding to the input pads IPD-120 of the flexible wire substrate 122.

Hereinafter, an electrical connection structure (or configuration) of the first, second, and third electric components 110, 120, and 130 is described in more detail with reference to the pad unit of the display panel 110 and the output pad unit OPP-120 of the flexible wire substrate 122. An electrical connection structure between the second electric component 120 and the third electric component 130 may correspond to an electrical connection structure between the pad unit of the display panel 110 and the output pad unit OPP-120 of the flexible wire substrate 122 described below. In addition, the electric device 100 according to an exemplary embodiment of the present invention may include the first, second, and third electric components 110, 120, and 130, but the electric device 100 according to an exemplary embodiment of the present invention may omit one of the first electric component 110 and the third electric component 130, for example.

Figure 5:
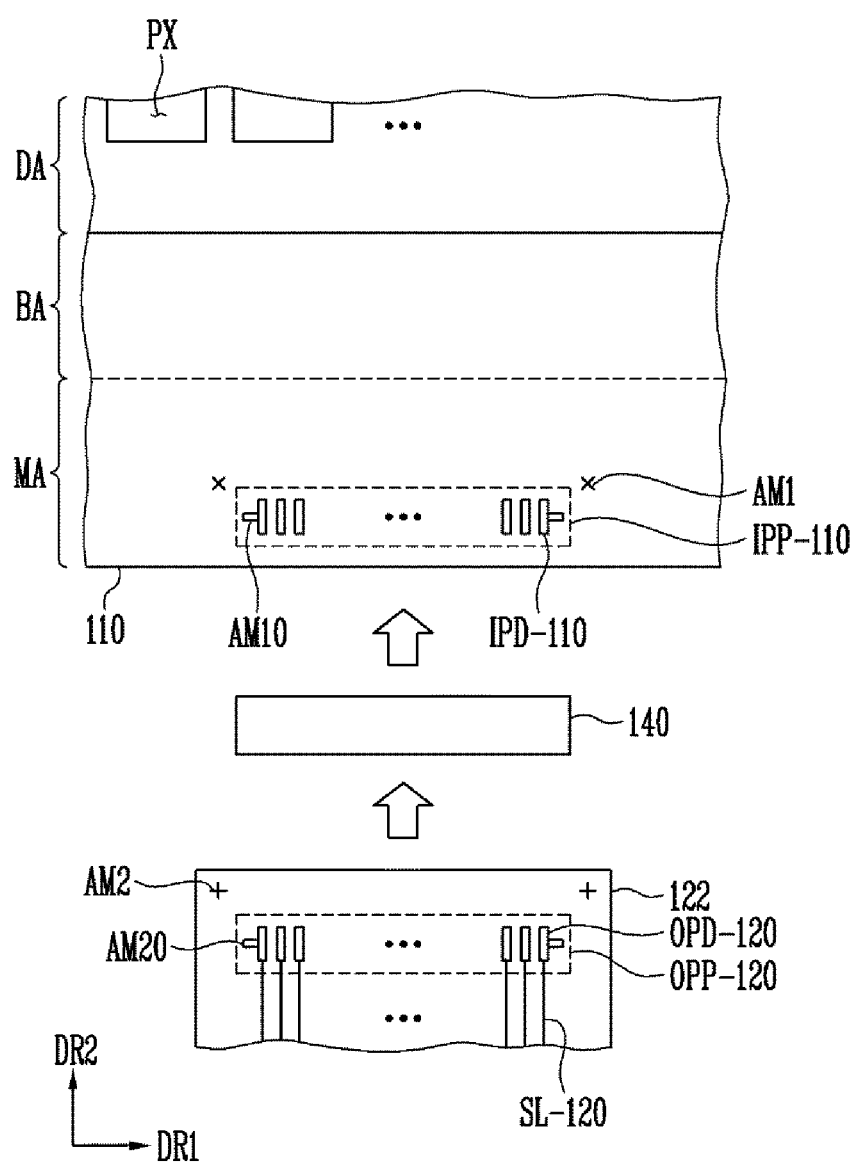
FIG. 5 is a plan view of divided pad units of two electric components shown in FIG. 1.
Figure 6:
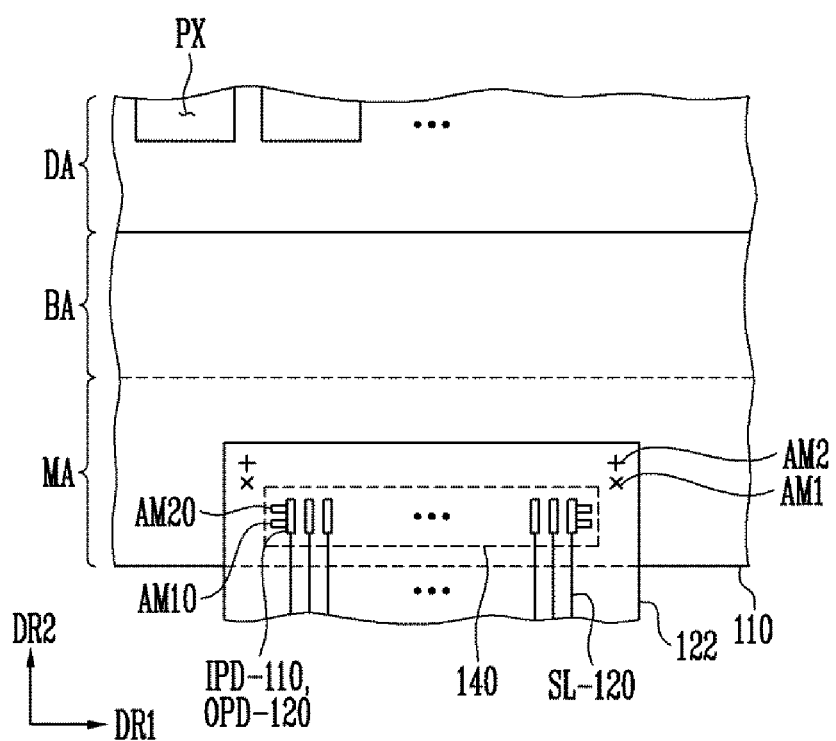
FIG. 6 is a plan view of combined pad units of two electric components shown in FIG. 1.

FIG. 5 is a plan view showing divided pad units of the two electric components shown in FIG. 1. FIG. 6 is a plan view showing combined pad units of the two electric components shown in FIG. 1.

As shown in FIG. 5, the display panel 110 includes an input pad unit IPP-110 corresponding to the output pad unit OPP-120 of the flexible wire substrate 122. The input pad unit IPP-110 includes input pads IPD-110 corresponding to the output pads OPD-120 of the flexible wire substrate 122. In an exemplary embodiment of the present invention, the input pads IPD-110 and the output pads OPD-120 are shown as having a 1:1 correspondence, but the invention is not limited thereto. In another exemplary embodiment of the present invention, the input pad unit IPP-110 and the output pad unit OPP-120 may include a different number of pads and a different number of pad rows from each other, for example.

The display panel 110 may include third alignment marks AM1 and fourth alignment marks AM10 respectively corresponding to the first alignment marks AM2 and second alignment marks AM20 of the flexible wire substrate 122. One of the third and fourth alignment marks AM1 and AM10 may be omitted.

As shown in FIG. 6, the output pads OPD-120 of the flexible wire substrate 122 and the input pads IPD-110 of the display panel 110 are electrically connected to each other. The output pad unit OPP-120 and the input pad unit IPP-120 are aligned using the first and second alignment marks AM2 and AM20 of the flexible wire substrate 122 and the third and fourth alignment marks AM1 and AM10 and an alignment correction may be performed in (e.g., along) the second direction DR2. Then, the output pads OPD-120 and the input pads IPD-110 may be bonded by using the bonding apparatus (e.g., a tool) with the conductive adhesive film 140 therebetween.

Hereinafter, a structure of the bonding apparatus according to an exemplary embodiment of the present invention for bonding the second and third electric components 120 and 130 on the display panel 110 is described in more detail.

Figure 7:
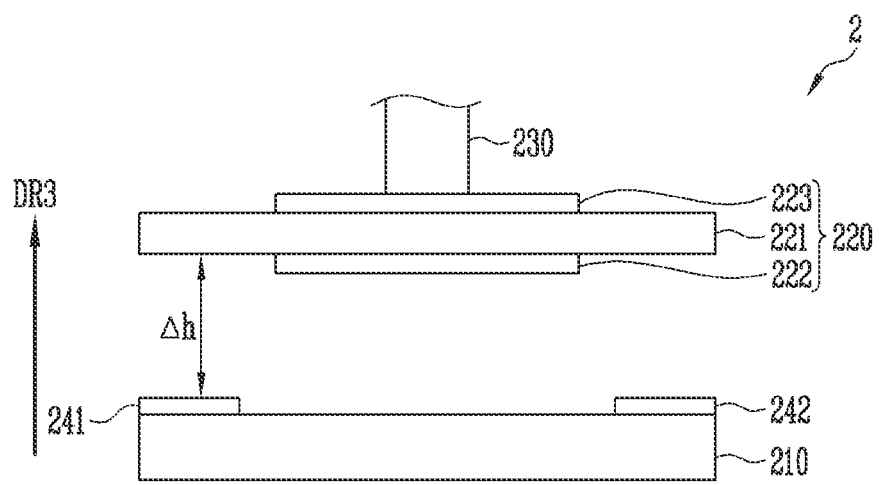
FIG. 7 is a schematic diagram of a structure of a bonding apparatus according to an exemplary embodiment of the present invention.

FIG. 7 is a schematic diagram showing a structure of a bonding apparatus 2 according to an exemplary embodiment of the present invention.

Referring to FIG. 7, the bonding apparatus 2 according to an exemplary embodiment of the present invention includes a stage 210 at which the display panel 110 is disposed and fixed, a pressing unit 220 for pressing the second electric component 120 (see, e.g., FIGS. 1-6) onto the display panel 110 fixed at the stage 210 with a conductive adhesive film 140 (see, e.g., FIGS. 1-6) therebetween, and a driver 230 for driving the pressing unit 220.

The stage 210 may fix the display panel 110 by a vacuum suction method or a mechanical coupling method, for example.

The pressing unit 220 includes a pressing head 221 on which a heat source 223 is disposed, and a pressing tip 222 is attached to one side (e.g., a first side) of the pressing head 221 and presses the conductive adhesive film 140 and the second electric component 120 onto the display panel 110 with the conductive adhesive film 140 therebetween. The heat source 223 may be fixed to the pressing head 221, for example, with a screw or the like. Heat generated from the heat source 223 may be applied to the conductive adhesive film 140 through the pressing head 221 and the pressing tip 222 so that conductive particles inside the conductive adhesive film 140 have fluidity (e.g., are changed to a fluid state). Accordingly, the bonding using the conductive adhesive film 140 may be made easier.

The driver 230 may control a driving of the pressing unit 220. For example, the driver 230 may control a driving of the pressing unit 220 so that the pressing unit 220 presses an object (e.g., the second electric component 120) with a load (e.g., a predetermined load) for an amount of time (e.g., a predetermined amount of time). For this purpose, the driver 230 may control an up and down movement (e.g., movement along a third direction DR3 and a negative third direction DR3) of the pressing unit 220 including an elevating structure composed of a cylinder or a motor.

In various exemplary embodiments of the present invention, the bonding apparatus 2 may further include a plurality of sensors 241 and 242. The sensors 241 and 242 may sense a change in capacitance between the sensors 241 and 242 and the pressing unit 220 as the pressing unit 220 moves up and down. For example, the sensors 241 and 242 may sense a change in capacitance between an upper surface of the sensors 241 and 242 and a lower surface of the pressing head 221.

In this exemplary embodiment, the sensors 241 and 242 may have a flat upper surface facing the pressing unit 220 and may be formed of a metal material. Similarly, the pressing head 221 may have at least one flat region at the lower surface thereof that faces the sensors 241 and 242 and may be formed of a metal material. The metal material may be aluminum, stainless steel, or the like, but is not limited thereto, and any suitable metal material may be used.

When a distance between the upper surface of each of the sensors 241 and 242 and the lower surface of the pressing head 221 changes as the pressing unit 220 moves up and down, the capacitance between each of the sensors 241 and 242 and the pressing head 221 is given by Equation 1.

$$\Delta C = \varepsilon \frac{A}{\Delta h} \quad \text{Equation 1}$$

Here, $\Delta C$ is a change in capacitance, $\varepsilon$ is a capacitance coefficient, A is an area of a surface of which each of the sensors 241 and 242 face the pressing unit 220, and $\Delta h$ is a distance change between each of the sensors 241 and 242 and the pressing head 221 depending on the up and down movement of the pressing unit 220.

For example, as the pressing unit 220 moves down toward the stage 210 to press the second electric component 120 onto the display panel 110, a capacitance measured at the sensors 241 and 242 may increase. Conversely, as the pressing unit 220 completes the pressing process and moves away from the stage 210, a capacitance measured at the sensors 241 and 242 may decrease.

When the lower surface of the pressing head 221 is parallel to the upper surface of the stage 210, the change in capacitance measured at each of the sensors 241 and 242 during the pressing process may be substantially the same within an error range (e.g., a predetermined error range). However, when the lower surface of the pressing head 221 is not parallel to the upper surface of the stage 210, the change in capacitance measured at each of the sensors 241 and 242 during the pressing process is different from each other and may deviate from the error range.

The lower surface of the pressing head 221 and the upper surface of the stage 210 may not be parallel to each other due to mechanical defects of the pressing unit 220 or deterioration or deformation of the pressing unit 220 due to long-term or repeated use. As such, when pressing the second electric component 120 on the display panel 110 by using the pressing unit 220, a load of the pressing tip 222 may be concentrated at (or on) a specific portion of the display panel 110, thereby causing damage to the display panel 110 and/or poor bonding.

Accordingly, in an exemplary embodiment of the present invention, the changes in capacitance with the pressing unit 220 are measured using a plurality of sensors 241 and 242 provided at the stage 210, and by comparing the measured changes in capacitance, an equilibrium state (e.g., a slope) of the pressing unit 220 is judged or determined, and a uniformity of a pressing load is ensured in the entire region of the pressing unit 220 when pressing, or a likelihood of applying a non-uniform pressing load is reduced.

The change in capacitance sensed by the sensors 241 and 242 may be transferred to an external controller or monitoring device and may be used for equilibrium calibration of the pressing unit 220. For example, the equilibrium calibration of the pressing unit 220 may be performed by the driver 230.

In some embodiments, only two sensors 241 and 242 are provided, as illustrated in FIG. 7, but the present invention is not limited thereto, and three or more sensors 241 and 242 may be provided, for example. The sensors 241 and 242 may be disposed at various suitable positions (e.g., at each edge or at each side) on the stage 210.

In addition, the sensors 241 and 242 may be provided as separate elements on the stage 210, as illustrated in FIG. 7, but the present invention is not limited thereto. For example, the sensors 241 and 242 may be mounted within the stage 210.

In another exemplary embodiment of the present invention, the sensors 241 and 242 may be integrated with the stage 210 at different positions on the stage 210. For example, the sensors 241 and 242 may be conductors provided at corresponding positions of the stage 210.

FIGS. 8A-8F illustrate a process of bonding electric components using the bonding apparatus 2 shown in FIG. 7.

Figure 8A:
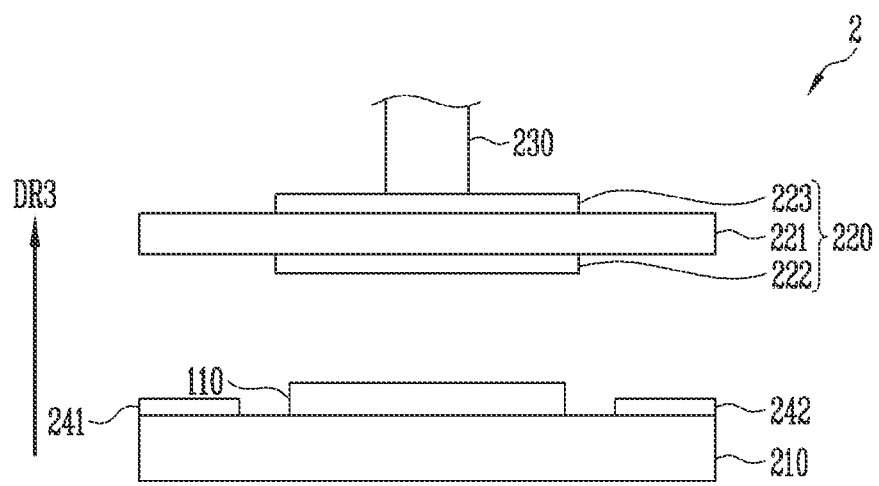
FIGS. 8A-8F are schematic diagrams of a process of bonding electric components using the bonding apparatus shown in FIG. 7.

First, referring to FIG. 8A, the display panel 110 is fixed on the stage 210 of the bonding apparatus 2. The display panel 110 may be fixed on the stage 210 by a vacuum suction method or a mechanical coupling method, for example.

Figure 8B:
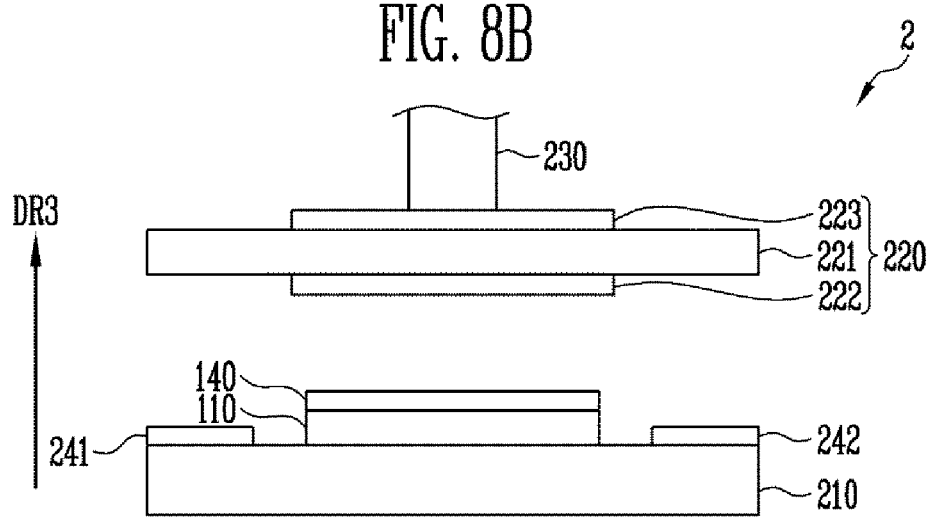

Next, referring to FIG. 8B, the conductive adhesive film 140 is attached to (or on) the display panel 110. For example, when the conductive adhesive film 140 is transferred onto the display panel 110 by a transfer device (e.g., transfer means) or the like, the pressing unit 220 is driven by the driver 230 to transfer heat and pressure to the conductive adhesive film 140. Then, the pressing unit 220 may be spaced from the conductive adhesive film 140 and a release film may be removed from the conductive adhesive film 140.

Figure 8C:
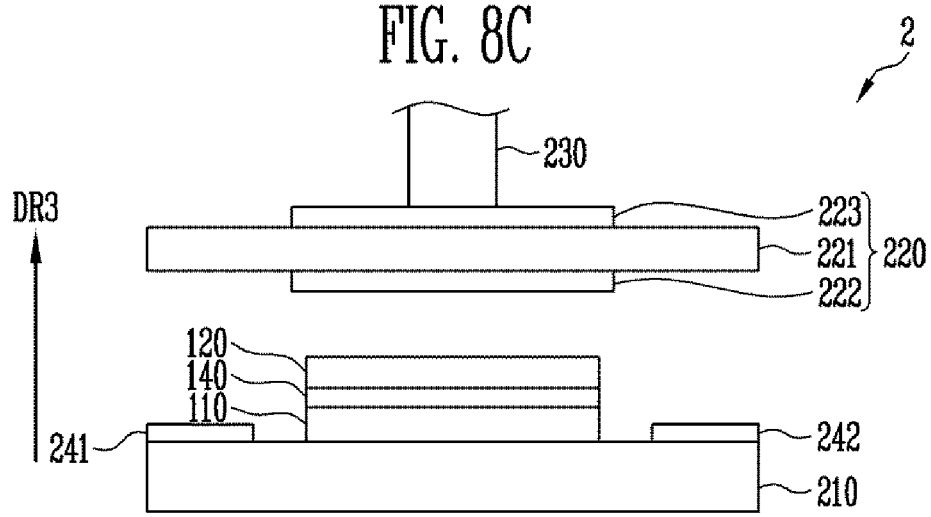

Next, referring to FIG. 8C, the second electric component 120 is aligned and pre-pressed on the display panel 110 to which the conductive adhesive film 140 is attached. For example, when the second electric component 120 is transferred onto the display panel 110 by the transfer device or the like, the display panel 110 and the second electric component 120 may be aligned by using the first, second, third, and fourth alignment marks AM2, AM20, AM1, and AM10 (see, e.g., FIGS. 1-6). Then, the pressing unit 220 is driven by the driver 230 to apply heat and pressure to the second electric component 120 and the conductive adhesive film 140. The pressing unit 220 may then be spaced from the second electric component 120.

Figure 8D:
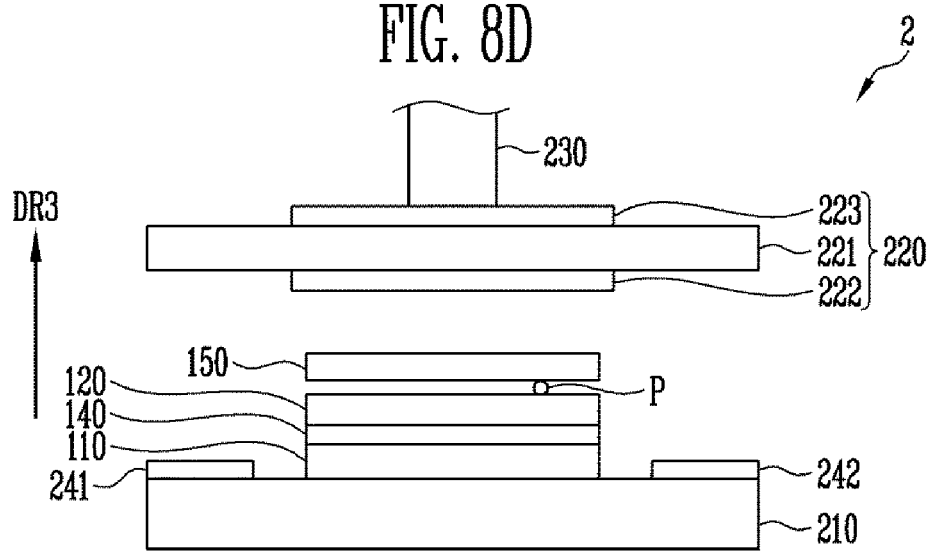
Figure 8E:
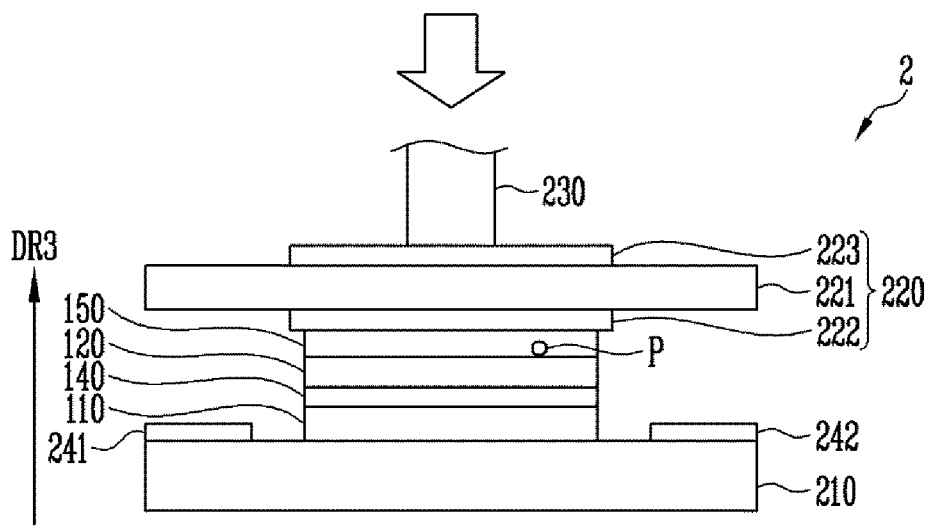
Figure 8F:
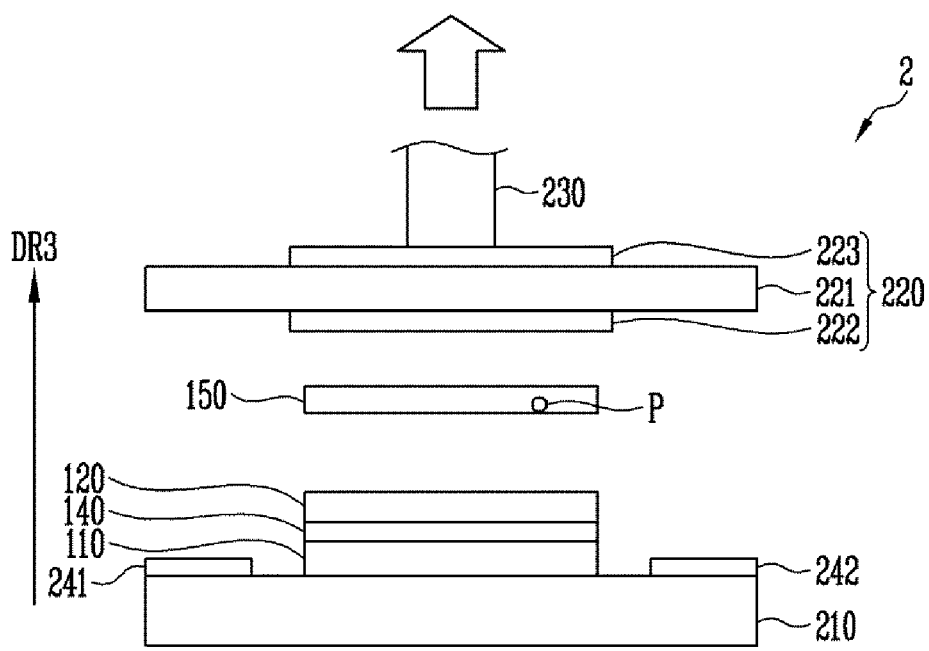

Referring to FIGS. 8D-8F, a main pressing process may be performed after the pre-pressing process. In various exemplary embodiments of the present invention, a dummy film 150 may be used in the main pressing process.

The dummy film 150 may function as a buffer member in the pressing process. For this purpose, the dummy film 150 may be formed of an elastic material, such as a urethane-based material and/or acryl based material. For example, the dummy film 150 may be formed of a sponge foamed with a urethane-based and/or an acryl-based material. However, the material constituting the dummy film 150 is not limited to the above, and any suitable material may be used.

In addition, the dummy film 150 may function to remove particles P that may inflow between the second electric component 120 and the pressing unit 220 during the main pressing process. As such, at least one side of the dummy film 150 may be adhesive (e.g., may have an adherence). According to one exemplary embodiment, the adherence of the dummy film 150 to the second electric component 120 may be sufficiently smaller than an adherence to which the second electric component 120 is attached to the display panel 110 by the conductive adhesive film 140 through the subsequent main pressing process. Accordingly, the dummy film 150 may be easily removed from the second electric component 120 after the main pressing process.

In the various exemplary embodiments of the present invention, as shown in FIG. 8D, the dummy film 150 is disposed on the second electric component 120 pre-pressed by the transfer device or the like. However, in another exemplary embodiment, the dummy film 150 may be integrally provided to the pressing unit 220, for example, at the pressing tip 222.

Then, as shown in FIG. 8E, the pressing unit 220 may be driven by the driver 230 to apply heat and pressure to the dummy film 150, the second electric component 120, and the conductive adhesive film 140. The heat and pressure applied by the pressing unit 220 in the main pressing process may be greater than the heat and pressure applied by the pressing unit 220 in the pre-pressing process.

While the pressing unit 220 presses the dummy film 150 and the second electric component 120, the particles P inflowed onto the second electric component 120 may be attached to the dummy film 150. Then, as shown in FIG. 8F, the pressing unit 220 may be spaced from the second electric component 120 and the dummy film 150 may be removed from the second electric component 120. The particles P attached to the dummy film 150 may be removed from the second electric component 120 together with the dummy film 150.

In various exemplary embodiments of the present invention, the sensors 241 and 242 may measure the change in capacitance between the sensors 241 and 242 and the pressing unit 220 (e.g., between the stage 210 and the pressing unit 220) during the bonding process, respectively. Based on the measuring result of the change in capacitance of the sensors 241 and 242, the equilibrium state (e.g., the slope) of the pressing unit 220 may be measured. A measuring result (e.g., a measurement) of the equilibrium state of the pressing unit 220 may be transferred (or transmitted) to an external controller, a monitoring device, or the driver 230 and used for equilibrium calibration of the pressing unit 220.

In an exemplary embodiment of the present invention, the sensors 241 and 242 may be controlled to be in an OFF state during the process shown in FIGS. 8A-8D and may be controlled to be in an ON state during the main pressing process shown in FIGS. 8E-8F. For example, the sensors 241 and 242 may measure the change in capacitance between the sensors 241 and 242 and the pressing unit 220 only while the pressing unit 220 moves up and down for the main pressing process. Accordingly, excessive accumulation of unnecessary change data in capacitance and excessive power consumption may be avoided or mitigated.

FIGS. 9A-9C, 10A-10C, and 11A-11C are schematic diagrams showing a structure of a pressing unit according to various exemplary embodiments of the present invention.

Figure 9A:
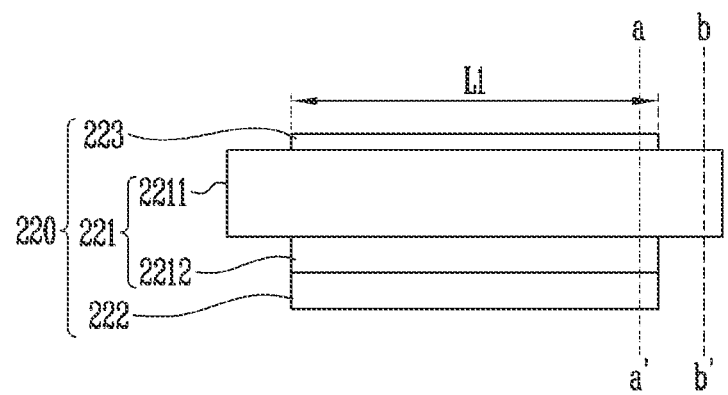
FIGS. 9A-9C are schematic diagrams of a structure of a pressing unit according to an exemplary embodiment of the present invention.
Figure 9B:
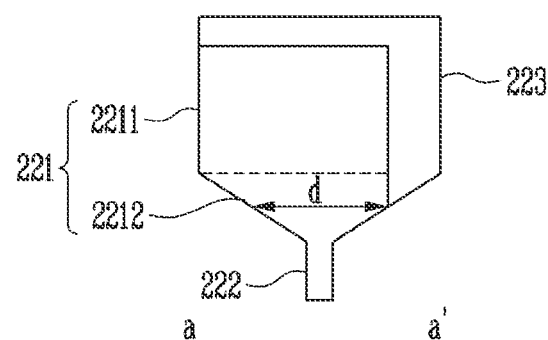
Figure 9C:
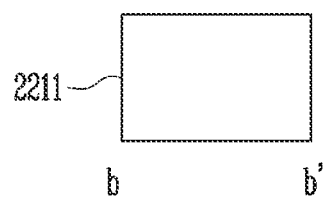

First, FIG. 9A shows the structure of the pressing unit 220 according to a first exemplary embodiment of the present invention, FIG. 9B is a cross-sectional view taken along the line a-a' of FIG. 9A, and FIG. 9C is a cross-sectional view taken along the line b-b' of FIG. 9A.

Referring to FIGS. 9A-9C, the pressing unit 220 includes the pressing head 221, the pressing tip 222, and the heat source 223. The pressing head 221 may include a main body 2211 and a connection part 2212. The main body 2211 may be coupled to the driver 230 and may have a square pillar shape, as shown in FIGS. 9A-9C.

The connection part 2212 extends downwardly toward the stage 210 in at least one region of the main body 2211. Accordingly, the connection part 2212 is not formed in another region of the main body 2211. Here, the other region may be, for example, both sides of the main body 2211. A side width d of the connection part 2212 may be narrower as the connection part 2212 is farther from the main body 2211. For example, as the connection part 2212 is farther from the main body 2211, a cross-sectional area of the connection part 2212 becomes smaller.

A lower surface of the other region of the main body 2211 where the connection part 2212 does not extend, for example, a lower surface of both sides of the main body 2211, may be flat. The flat lower surface of both sides of the main body 2211 face the sensors 241 and 242 (see, e.g., FIG. 7), thereby allowing the change in capacitance to be measured correctly by the sensors 241 and 242. In an exemplary embodiment of the present invention, when the main body 2211 is formed of a material other than metal, an electrode or the like including a metal material may be formed on the flat lower surface of both sides of the main body 2211.

The pressing tip 222 extends downwardly from the connection part 2212. The pressing tip 222 may have a square pillar shape. However, the present invention is not limited thereto, and the lower surface of the pressing tip 222 may have a shape and size corresponding to a pressed object, for example. However, because the side width of the connection part 2212 may become narrower as the connection part 2212 extends farther from the main body 2211, a side width of the pressing tip 222 extending from a lower end of the connection part 2212 is narrower than the side width of the main body 2211 of the pressing head 221.

The heat source 223 may be configured to enclose (e.g., cover) at least one surface of the main body 2211 of the pressing head 221. For example, the heat source 223 may be configured to enclose at least one portion of an upper surface and the lower surface of the main body 2211 as shown in FIGS. 9A-9C. In various exemplary embodiments of the present invention, the heat source 223 may be configured to enclose only one portion of at least one side of the main body 2211. In this exemplary embodiment of the present invention, a front length L1 of the heat source 223 may be shorter than a front length of the main body 2211.

Figure 10A:
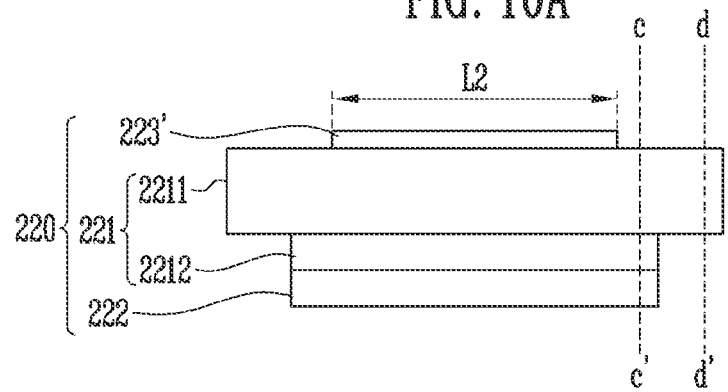
FIGS. 10A-10C are schematic diagrams of a structure of a pressing unit according to an exemplary embodiment of the present invention.
Figure 10B:
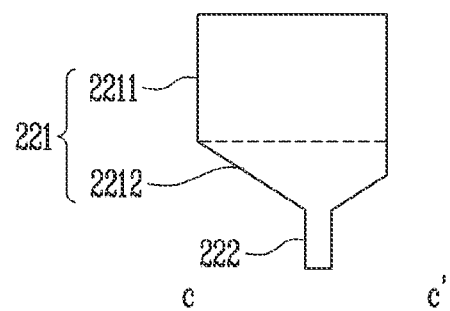
Figure 10C:
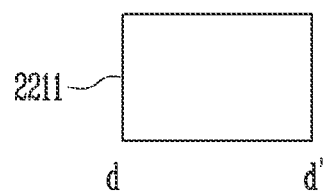

FIG. 10A shows a structure of the pressing unit 220 according to a second exemplary embodiment of the present invention, FIG. 10B is a cross-sectional view taken along the line c-c' of FIG. 10A, and FIG. 10C is a cross-sectional view taken along the line d-d' of FIG. 10A.

Referring to FIGS. 10A-10C, a heat source 223' of the pressing unit 220 according to the second exemplary embodiment of the present invention has a shorter front length L2 than the front length L1 of the heat source 223 shown in FIGS. 9A-9C. As described above, the heat source 223' need not be configured to enclose (e.g., cover) the whole of at least one side of the main body 2211, and it is sufficient that the heat source 223' is provided in such a size and shape that the heat provided by the heat source 223' can be efficiently transferred to the object to be pressed through the main body 2211, the connection part 2212, and the pressing tip 222.

Figure 11A:
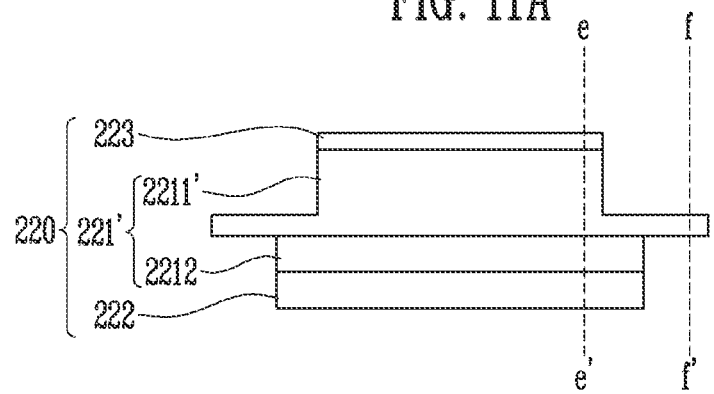
FIGS. 11A-11C are schematic diagrams of a structure of a pressing unit according to an exemplary embodiment of the present invention.
Figure 11B:
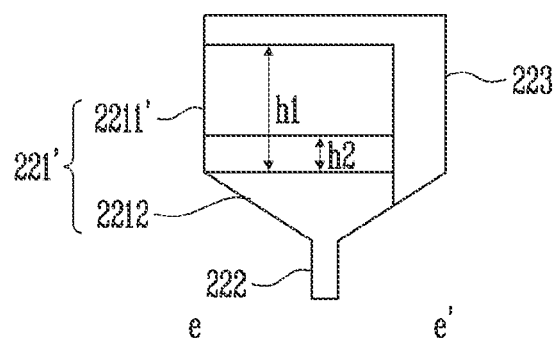
Figure 11C:
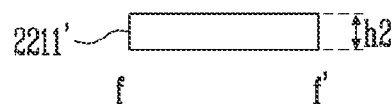

FIG. 11A shows a structure of the pressing unit 220 according to a third exemplary embodiment of the present invention, FIG. 11B is a cross-sectional view taken along the line e-e' of FIG. 11A, and FIG. 11C is a cross-sectional view taken along the line f-f' of FIG. 11A.

Referring to FIGS. 11A-11C, at both sides of a main body 2211' where the connection part 2212 is not formed, the main body 2211' has a height h2 at a first region that is less than a height h1 of a second region thereof. For example, a cross-sectional area of the main body 2211' is reduced in a region (e.g., the first region) where the connection part 2212 is not formed.

Because both sides of the main body 2211' where the connection part 2212 is not formed (e.g., because the first region of the main body 2211') are formed to provide a flat surface facing the sensors 241 and 242, the shape of both sides of the main body 2211' is not particularly limited as long as the lower surface of both sides of the main body 2211' is flat.

Therefore, the first region (e.g., both sides) of the main body 2211' may be formed to have at least one of a smaller height, width, and area than the second region of the main body 2211'. Because the first region of the main body 2211' is formed smaller than the second region of the main body 2211', the bonding apparatus may be smaller and lighter weight.

The shapes of the both sides of the main body 2211' shown in FIGS. 11A-11C are merely examples, and the present invention is not limited to the embodiments shown in FIGS. 11A-11C.

Figure 12:
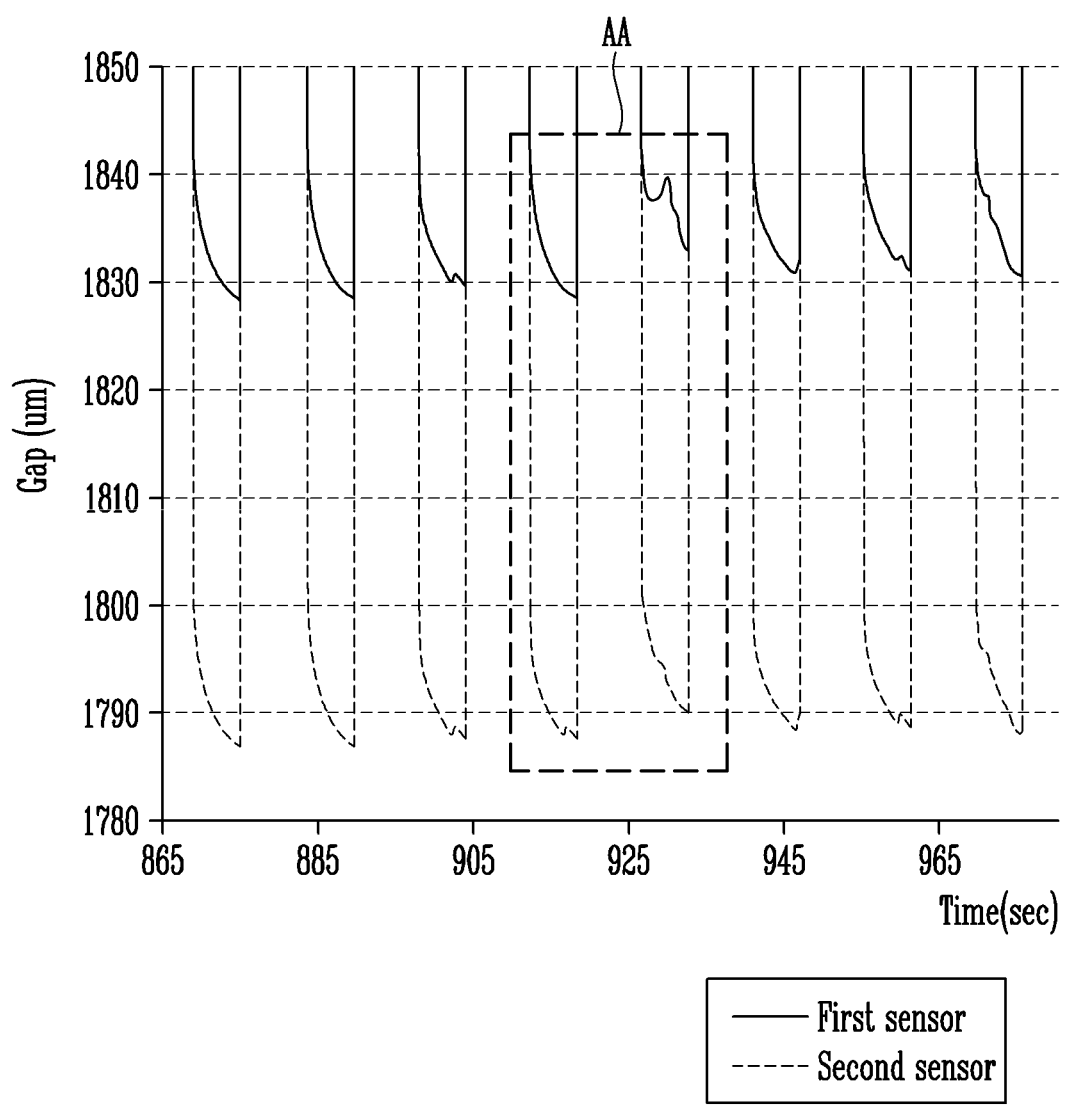
FIGS. 12-14 are graphs illustrating a method of determining an equilibrium state of a pressing unit using a sensor measurement according to various exemplary embodiments of the present invention.
Figure 13:
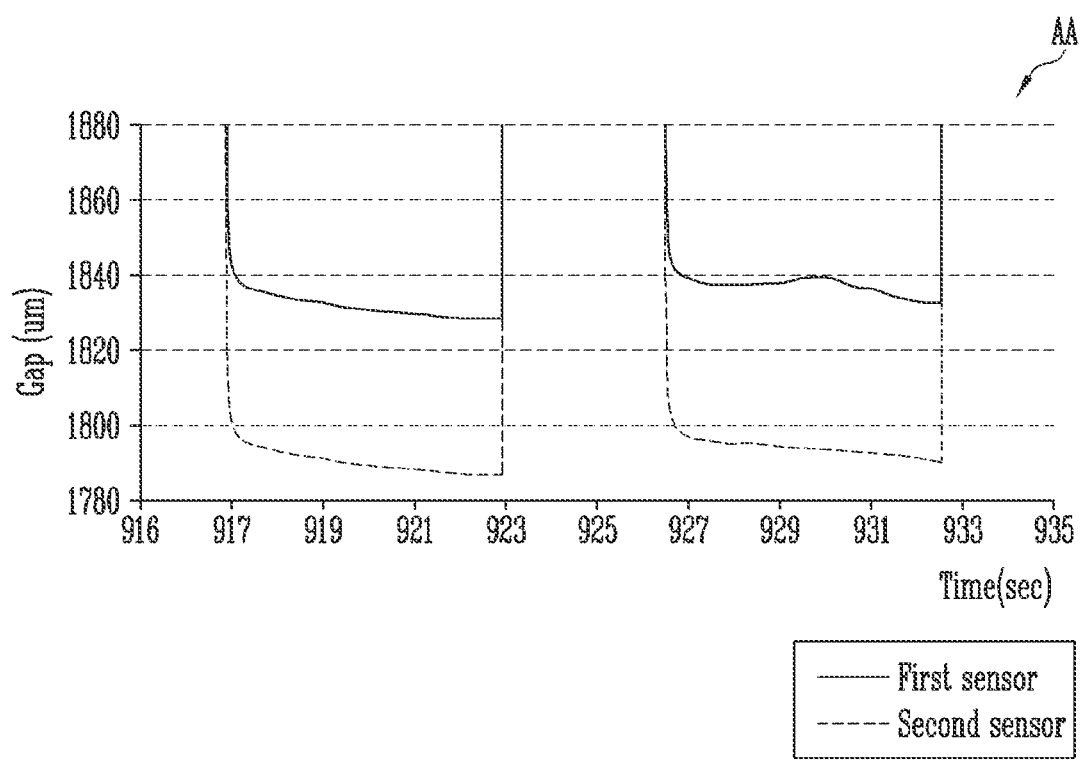
Figure 14:
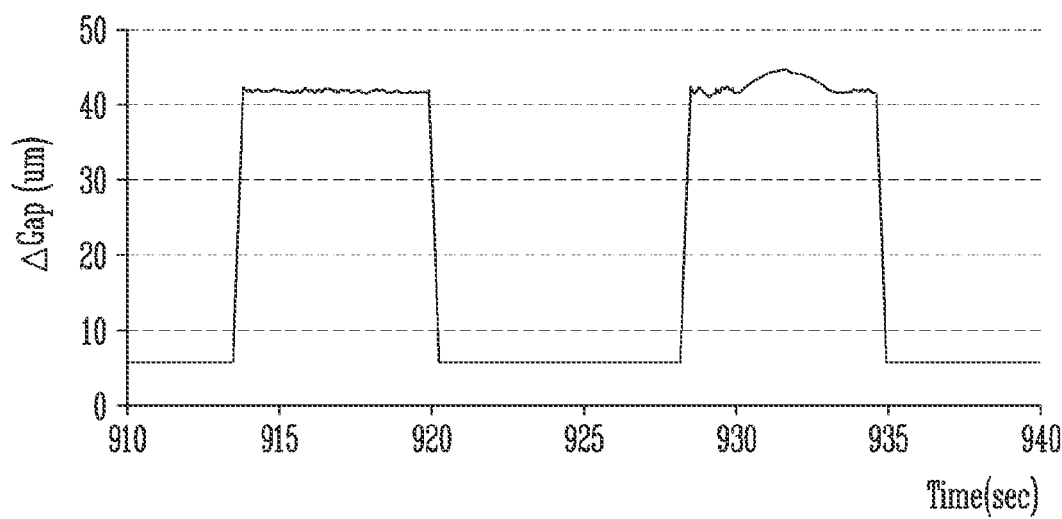

FIGS. 12-14 are graphs illustrating a method of determining an equilibrium state of a pressing unit by using a sensor measurement according to various exemplary embodiments of the present invention. FIG. 12 is a graph showing the change in a distance between the sensors 241 and 242 and the pressing unit 220 (e.g., the lower surface of the pressing head 221), which are based on a change in capacitance measured by the first sensor 241 and the second sensor 242 while the main pressing process is repeatedly performed by the bonding apparatus 2 shown in FIG. 7. FIG. 13 is a graph showing the enlarged region AA of FIG. 12, and FIG. 14 is a graph showing a difference between capacitances measured by the first sensor 241 and the second sensor 242 in the region AA of FIG. 12.

When the lower surface of the pressing head 221 is parallel to the upper surface of the stage 210, the change in capacitance measured at each of the sensors 241 and 242 during the pressing process may be substantially the same within an error range (e.g., a predetermined error range). Therefore, the change in the distance between the lower surface of the pressing head 221 and each of the sensors 241 and 242, which is determined through Equation 1 from the measured change in capacitance, may be substantially the same as a graph shown in a left side of FIGS. 13-14.

Here, the distance between each of the first sensor 241 and the second sensor 242 and the pressing head 221 may be different depending on a difference in a thickness of the sensor itself.

However, when the lower surface of the pressing head 221 is not parallel to the upper surface of the stage 210, the change in capacitance measured at each of the sensors 241 and 242 during the pressing process may deviate from the error range and the capacitance of each may be different from each other. Therefore, the change in the distance between the lower surface of the pressing head 221 and each of the sensors 241 and 242, which is determined through Equation 1 from the measured change in capacitance, may be different from each other as illustrated in a graph shown in a right side of FIGS. 13 and 14.

As described above, in the present invention, the change in capacitance between the stage 210 and the pressing unit 220 is measured by using at least two sensors disposed at various points on the stage 210. The present invention may indirectly determine the distance between the stage 210 and the pressing unit 220 at various points on the stage 210 from the measured change in capacitance and, thus, determine an equilibrium state of the pressing unit 220.

Those of ordinary skill in the technical field of the present invention understand that the present invention can be carried out in other specific forms without changing the technical idea or essential features. The exemplary embodiments should be considered in descriptive sense only and not for purposes of limitation. Therefore, the scope of the present invention is defined not by the detailed description of the present invention but by the appended claims and their equivalents, and all differences within the scope will be construed as being included in the present invention.

What is claimed is:

1. A bonding method comprising:
   fixing a first electric component on a stage;
   attaching a conductive adhesive film on the first electric component;
   arranging a second electric component on the conductive adhesive film;
   arranging a dummy film on the second electric component;
   pressing the conductive adhesive film, the second electric component, and the dummy film by driving a pressing unit; and
   removing the dummy film,
   wherein a first side of the dummy film which contacts the second electric component is adhesive.

2. The bonding method of claim 1, wherein the first side of the dummy film is configured to remove particles that inflow onto the second electric component.

3. The bonding method of claim 1,
   wherein a plurality of sensors are located at different locations on the stage, and
   wherein the pressing the conductive adhesive film, the second electric component, and the dummy film by driving the pressing unit comprises sensing a change in capacitance between each of the plurality of sensors and the pressing unit.

4. The bonding method of claim 3, further comprising controlling an equilibrium state of the pressing unit based on a result of the sensing the change in capacitance between each of the plurality of sensors and the pressing unit.

5. The bonding method of claim 3, wherein the capacitance changes in response to a distance between each of the plurality of sensors and the pressing unit.

6. The bonding method of claim 5, wherein the change in capacitance sensed in each of the plurality of sensors is the same at an equilibrium state of the pressing unit when the pressing unit presses.

* * * * *